(12) United States Patent
Kurcik et al.

(10) Patent No.: US 11,596,059 B2
(45) Date of Patent: Feb. 28, 2023

(54) CIRCUIT CARRIER FOR A BATTERY SYSTEM AND BATTERY SYSTEM

(71) Applicant: Samsung SDI Co., Ltd., Yongin-si (KR)

(72) Inventors: Peter Kurcik, Sankt Nikolai im Sausal (AT); Thomas Korherr, Hartberg (AT); Birgit Weissensteiner, Graz (AT)

(73) Assignee: SAMSUNG SDI CO., LTD., Yongin-si (KR)

( * ) Notice: Subject to any disclaimer, the term of this patent is extended or adjusted under 35 U.S.C. 154(b) by 348 days.

(21) Appl. No.: 16/744,779

(22) Filed: Jan. 16, 2020

(65) Prior Publication Data
US 2020/0236779 A1 Jul. 23, 2020

(30) Foreign Application Priority Data

Jan. 18, 2019 (EP) .................................... 19152476
Jan. 16, 2020 (KR) ........................ 10-2020-0006085

(51) Int. Cl.
| | |
|---|---|
| *G01R 31/00* | (2006.01) |
| *H05K 1/02* | (2006.01) |
| *H05K 1/18* | (2006.01) |
| *H01M 10/42* | (2006.01) |
| *H01M 10/48* | (2006.01) |

(Continued)

(52) U.S. Cl.
CPC ....... *H05K 1/0278* (2013.01); *G01R 19/0084* (2013.01); *H01M 10/425* (2013.01); *H01M 10/48* (2013.01); *H05K 1/115* (2013.01); *H05K 1/189* (2013.01); *H01M 2010/4271* (2013.01);

(Continued)

(58) Field of Classification Search
USPC .......................................... 324/426; 320/112
See application file for complete search history.

(56) References Cited

U.S. PATENT DOCUMENTS

| | | |
|---|---|---|
| 5,495,076 A | 2/1996 | Davis |
| 2007/0202307 A1 | 8/2007 | Oh et al. |

(Continued)

FOREIGN PATENT DOCUMENTS

| | | |
|---|---|---|
| CN | 203218526 U | 9/2013 |
| DE | 41 31 934 A1 | 4/1993 |

(Continued)

OTHER PUBLICATIONS

European Office action issued in corresponding application No. 19 152 476.8, dated Nov. 23, 2021, 7 pages.

(Continued)

*Primary Examiner* — Vincent Q Nguyen
(74) *Attorney, Agent, or Firm* — Lewis Roca Rothgerber Christie LLP

(57) ABSTRACT

A circuit carrier is configured to be mounted to a battery system. The circuit carrier includes a circuit carrier board having a first region, a second region, and a third region. The first region is configured to receive a shunt resistor, the third region is configured to receive further electronic components, and the first region and the third region being separated from each other by the second region. The second region is a flexible connection between the first region and the third region and includes a spring-like structure formed from the circuit carrier board.

14 Claims, 9 Drawing Sheets

(51) Int. Cl.
*G01R 19/00* (2006.01)
*H05K 1/11* (2006.01)

(52) U.S. Cl.
CPC .............. *H05K 2201/10022* (2013.01); *H05K 2201/10037* (2013.01); *H05K 2201/10151* (2013.01)

(56) References Cited

U.S. PATENT DOCUMENTS

| | | |
|---|---|---|
| 2013/0302651 A1 | 11/2013 | Kim et al. |
| 2014/0003016 A1 | 1/2014 | McCabe et al. |
| 2014/0015636 A1* | 1/2014 | Tanaka ............... H01C 1/14 338/322 |
| 2016/0150636 A1 | 5/2016 | Otsubo |
| 2017/0194670 A1* | 7/2017 | Kawano ............. H02J 7/0032 |
| 2018/0005733 A1 | 1/2018 | Shinotake |
| 2019/0260070 A1* | 8/2019 | Kishimoto ........... H01M 4/133 |
| 2019/0260096 A1* | 8/2019 | Nakajima ........... H01M 10/482 |

FOREIGN PATENT DOCUMENTS

| | | |
|---|---|---|
| DE | 10 2010 039 277 A1 | 2/2012 |
| EP | 0 398 565 A2 | 11/1990 |
| KR | 10-0666224 B1 | 1/2007 |
| KR | 10-2013-0125334 A | 11/2013 |
| KR | 10-2016-0135453 A | 11/2016 |
| KR | 10-1687384 B1 | 12/2016 |
| WO | WO 2007/087981 A1 | 8/2007 |
| WO | WO 2014/120688 A1 | 8/2014 |

OTHER PUBLICATIONS

Extended Search Report issued in EP 19152476.8, dated Aug. 27, 2019, 7 pages.
Korean Office action issued in corresponding application No. 10-2020-0006085, dated Dec. 6, 2022, 9 pages including English translation.

* cited by examiner

CIRCUIT CARRIER FOR A BATTERY SYSTEM AND BATTERY SYSTEM

CROSS-REFERENCE TO RELATED APPLICATION

This application claims priority to and the benefit of Korean Patent Application No. 10-2020-0006085, filed in the Korean Intellectual Property Office on Jan. 16, 2020, and European Patent Application No. 19152476.8, filed in the European Patent Office on Jan. 18, 2019, the entire contents of which are incorporated herein by reference.

BACKGROUND

1. Field

Aspects of embodiments of the present invention relate to a circuit carrier for a battery system and a battery system including such a circuit carrier.

2. Related Art

A rechargeable (or secondary) battery differs from a primary battery in that it is designed to be repeatedly charged and discharged, while the latter is designed to provide an irreversible conversion of chemical to electrical energy. Low-capacity rechargeable batteries may be used as a power supply for small electronic devices, such as cellular phones, notebook computers, and camcorders, while high-capacity rechargeable batteries may be used as a power supply for electric or hybrid vehicles and the like.

Generally, rechargeable batteries include an electrode assembly including a positive electrode, a negative electrode, and a separator interposed between the positive and negative electrodes, a case receiving (or accommodating) the electrode assembly, and an electrode terminal electrically connected to the electrode assembly. An electrolyte solution is injected into the case to enable charging and discharging of the battery via an electrochemical reaction between the positive electrode, the negative electrode, and the electrolyte solution. The shape of the case, such as cylindrical or rectangular, may be suitably varied based on the battery's intended purpose.

Rechargeable batteries may be used in a battery module, which may be formed of a plurality of unit battery cells coupled to each other in series and/or in parallel to provide high energy density for, as an example, motor driving of a hybrid vehicle. For example, the battery module is formed by interconnecting electrode terminals of the plurality of unit battery cells to each other, the number of unit battery cells depending on a desired amount of power. to realize a high-power rechargeable battery for, as an example, an electric vehicle.

Battery modules can have either a block design or a modular design. In the block design, each battery cell is coupled to a common current collector structure and a common battery management system. In the modular design, pluralities of battery cells are connected to each other to form submodules, and several submodules are connected to each other to form the battery module. Battery management functions may be provided either on module or submodule level and, thus, interchangeability of components is improved. One or more battery modules may be mechanically and electrically integrated, equipped with a thermal management system, and configured to communicate with one or more electric consumers to form a battery system.

To provide thermal control of a battery system, a thermal management system may be included in at least one battery module to safely use the at least one battery module by efficiently emitting, discharging, and/or dissipating heat generated by the rechargeable batteries. If the heat emission/discharge/dissipation is not sufficiently performed, temperature deviations occur between respective battery cells, such that the battery module may no longer generate an anticipated amount of power. In addition, an increase in the internal temperature of a rechargeable battery can lead to abnormal reactions occurring therein, and thus, charging and discharging performance of the rechargeable battery may deteriorate and the life-span of the rechargeable battery may be shortened. Thus, cooling devices for effectively emitting/discharging/dissipating heat from the cells are often provided.

Static control of the battery power output and charging may not be sufficient to meet the dynamic power demands of various electrical consumers connected to the battery system. Thus, steady exchange of information between the battery system and the controllers of the electrical consumers may be employed. Such information includes the battery system's actual state of charge (SoC), potential electrical performance, charging ability, and internal resistance as well as actual or predicted power demands or surpluses of the consumers. Battery systems generally include a battery management system (BMS) to process this information.

The BMS is usually coupled to the controller of one or more electrical consumers as well as to each of the battery modules of the battery system. To control a plurality of battery modules with a single BMS, a daisy chain setup may be used. In such a setup, the BMS, as master, is connected (for communication) in series to a plurality of battery modules, such as to a plurality of cell supervision circuits (CSCs) of the respective battery modules. Daisy chain setups as well as corresponding protocols are known to those skilled in the art.

A battery system 100 with a daisy chain setup according to the related art is illustrated in FIG. 1. In the battery system 100, a BMS 50 is configured to communicate with a plurality of battery modules 90, each of the battery modules 90 include a cell supervision circuit carrier 30. The cell supervision circuit carrier 30 includes a negative module terminal 93 and a positive module terminal 94. The negative module terminal 93 of a first battery module 90 is electrically connected to a negative system terminal 102 via a busbar 60. The positive module terminal 94 of the first battery module 90 is connected to the negative module terminal 93 of a subsequent battery module 90 via another busbar 60. The positive module terminal 94 of a last battery module 90 is connected to a positive system terminal 101 to provide a power connection.

To provide a communication connection between the battery modules 90 and the BMS 50, each cell supervision circuit carrier 30 further includes a connector 32 to provide a daisy chain. The connector 32 acts as input/output for communication between the BMS 50 and the CSCs of the battery modules 90. One wiring harness 31 connects a connector 32 of the BMS 50 with the connectors 32 of all of the cell supervision circuit carriers 30. Different from the battery system 100 shown in FIG. 1, a daisy chain optimized layout could be used, and other, different PCB designs could be used for the cell supervision circuit carriers 30.

The cell supervision circuit carriers 30, as shown in FIG. 1, generally include one or more shunt resistors to perform shunt-based current sensing. The current sensing may be performed with respect to at least one busbar 60 interconnecting adjacent battery modules or with respect to at least one busbar interconnecting terminals of battery cells within a single battery module. The integration of the shunt resistor on the cell supervision circuit carrier 30 is often provided by soldering the shunt directly on the printed circuit board (PCB) alongside (or with) the signal conditioning and measurement circuitry. In 48 V battery systems, the shunt resistor may be soldered to a PCB that includes (or forms) the entire BMS.

In the related art example, because the shunt resistor is mounted to the printed circuit board (PCB) of, for example, a CSC or a BMS, a rigid connection is created between the shunt and the PCB. While installing the PCB in a battery system, the PCB is further rigidly fixed to the battery housing and the shunt is connected to at least one bus bar. These connections between the PCB and the housing and the shunt and the bus bar may transfer mechanical stress, such as by bending or flexing, to the PCB, particularly because the PCB is often mechanically weaker than the connected housing and bus bars. Additionally, mechanical stress may arise during operation of the PCB when dimensional changes of the battery cells and/or the housing, for example, due to temperature changes, cell swelling, aging, etc., differ from dimensional changes of the PCB. Mechanical stress may further arise during assembly of the components, such as during the connecting (e.g., screwing) of the shunt to the bus bar. The printed circuit boards (PCBs) of a CSC or a BMS generally include additional mechanically sensitive components, such as ceramic capacitors or quartz crystals. These components can also be damaged by the application of mechanical stress to the PCB.

SUMMARY

One or more of the drawbacks of the prior art may be avoided or at least mitigated according to embodiments of the present invention. According to embodiments of the present invention, a circuit carrier for a battery system control unit is provided that applies less mechanical stress to the sensitive components mounted thereto.

According to embodiments of the present invention, a circuit carrier is provided that is configured to be mounted to a battery system, for example, on battery, submodule, module, or system. For example, the circuit carrier is configured to host a control unit for a battery system, and the control unit may include multiple components mounted (e.g., surface mounted) to the circuit carrier. The circuit carrier includes a circuit carrier board that forms the mechanical backbone of the circuit carrier. The circuit carrier may further include components such as a wire frame, wires, insulating or conductive surface coatings, and packaging materials. The circuit carrier board is, in some embodiments, a printed circuit board (PCB), but may be any other suitable substrate.

The circuit carrier board has a first region, a second region, and a third region. The first region is configured to receive a shunt resistor, and the third region is configured to receive further electronic components. The circuit carrier board is plate-shaped (e.g., has a cuboid shape) with a length and a width significantly exceeding the height. The first region and the third region are preferably separated from each other along the length direction and/or along the width direction. In one embodiment, the circuit carrier board is configured to receive surface mounted devices (SMDs). The first region may a first surface region of a first main surface or a second main surface opposite the first main surface, and the second region may be a second surface region of the same main surface as the first surface region.

The first region and the third region are separated from each other by the second region, the second region providing a flexible connection between the first region and the third region. For example, the second region is disposed between the first region and the third region along the width direction and/or the length direction of the cuboid circuit carrier board. The second region includes a spring-like structure that is formed from the circuit carrier board. The spring-like structure is configured to provide an elastic connection between the first region and the third region to, for example, deform under tension, torsion, and/or compression applied to at least one of the first region, second region, or third region. Further, the spring-like structure is formed from the circuit carrier board, that is, of the material of the circuit carrier board. The spring-like structure may be formed from the circuit carrier board by removing material therefrom by, for example, milling. The material of the circuit carrier board is removed such that at least one through-opening is formed in the second region, that is, the circuit carrier board is partially removed in the second region. Further, the remainder of the circuit carrier board is preferably shaped to provide a spring-like characteristic as, for example, a planar spring. For example, within the second region, the circuit carrier board is configured (or formed) as a planar spring.

The circuit carrier allows the first region and the third region of the circuit carrier board to be mechanically decoupled. Because the circuit carrier is configured to be mounted to a battery system by, for example, connecting the first region or the third region to the battery system, the other region (e.g., the second region) remains mechanically uncoupled from the battery system to a certain extent. Hence, mechanical impacts or vibrations transferred to one region of the circuit carrier connected to the battery system during installation of the circuit carrier to the battery system or during operation of the battery system are damped and/or less strongly transmitted to the other region. Further, any other impacts on one region, for example, while surface mounting a component, such as a shunt resistor, thereto, are damped and/or less strongly transmitted to the other region. The second region allows for compensation of dimensional changes of the circuit carrier and/or the battery system without stressing of the components installed thereon. The circuit carrier according to embodiments of the present invention allows for mechanically decoupling a shunt resistor that is (surface) mounted to the first region from further electronic components that are (surface) mounted to the third region.

As described above, the circuit carrier is configured to be mounted to a battery system by a mechanical connection to the battery system. The mechanical connection may be provided between the circuit carrier board and a battery cell, submodule, or module or a housing of the battery system. For example, the circuit carrier board may be configured to be mounted to the battery system or parts thereof. Further, an electric connection is formed between the circuit carrier and the battery system for measuring voltages and/or currents of the battery system and/or to transmit signals to the battery system. The electrical connection is provided by mounting a shunt resistor to the first region of the circuit carrier board, and electrically connecting the shunt resistor to a current path of the battery system. The shunt resistor may be connected to a busbar connecting terminals of two battery cells or modules of the battery system. And the shunt resistor may form at least a part of such a busbar itself. Also, conducting lines and/or conductive pads may be disposed on the circuit carrier board.

Any electrical connections or interconnections described herein may be provided by wires or conducting element on a PCB or another type of circuit carrier. The conducting elements may include metallization (e.g., surface metallization) and/or pins and/or may comprise conductive polymers or ceramics. Further electrical energy might be transmitted via wireless connections by using electromagnetic radiation and/or light. The third region that is configured to receive further electronic components includes at least one landing pad, contact pad, chip socket, or the like and further includes at least one electrical connection or interconnection for connecting the electronic components mounted or connected to the landing pads, contact pads, or chip sockets. However, electric connections between components connected to the third region may also be provided by wire bonds.

In one embodiment of the present invention, the spring-like structure in the second region of the circuit carrier includes at least one meandering-shaped structure. The meandering-shaped structure connects the first region and the third region. For example, the meandering-shaped structure includes a first section that is continuous with (e.g., integral with) the first region and a second section that is continuous with (e.g., integral with) the third region. Further, the remaining material of the second region, such as the material of the circuit carrier board, is removed within the second region except for the meandering-shaped structure. The meandering-shaped structure includes a structure, such as a continuous planar structure, which has at least one change of direction and, in some embodiments, a plurality of changes of direction. When the meandering-shaped structure has a planar structure, it can be divided into at least two substantial parts (e.g., without any infinitesimal parts or the like) that extend in different directions, with these substantial parts being connected to form the meandering-shaped structure. Exemplarily, a meandering-shaped structure may include multiple substantial parts that are substantially parallel and that are connected to each other to form a continuous meandering-shaped structure. Also, a meandering-shaped structure may be essentially Ω-shaped, with a first free end of the Ω shape being the first section described above and a second free end of the Ω shape being the second section described above. However, various other meandering-shaped structures are possible and may be used to provide the above-describes features of the second region.

In some embodiments, the spring-like structure of the circuit carrier include a plurality of meandering-shaped structures, and in some embodiments, a plurality of meandering-shaped structures as described above that are separated from each other by at least one through-opening. For example, the material of the circuit carrier board may be completely removed from a part (or portion) thereof to form the through-opening in the circuit carrier board. The through-opening, however, may not be enclosed by the circuit carrier board and may be located at an edge of the circuit carrier board. For example, the through-opening may form a part of an edge region of the circuit carrier board. Further, each of the separated meandering-shaped structures is connected to each of (e.g., extends between) the first region and the third region and includes a first section that is continuous with the first region and a second section that is continuous with the third region. In one embodiment, the second region includes the meandering-shaped structures and the through-openings. That is, the second region of the circuit carrier board is segmented (e.g., is fully segmented) into the structures and openings.

According to one embodiment, the at least one spring-like structure and the at least one meander-shaped structure are formed by milling. The cost impact on the circuit carrier according to this embodiment is minimal. Further, no additional production steps may be needed in the manufacturing of circuit carrier board as the milling process might may also form the outer contour of the circuit carrier board. Then, the milling of the meandering-shaped structure(s) only slightly increases the milling process time and, thus, the manufacturing process time. However, other methods may be used to form the spring-like structure and/or the meandering-shaped structure, such as laser cutting, waterjet cutting, or other suitable material removing techniques. Also, the circuit carrier board may be formed including the at least one spring-like structure and/or the at least one meandering-shaped structure by, for example, casting, injection molding, lamination, and/or the like. Thus, embodiments of the present invention are also directed to a method for manufacturing a circuit carrier having a first region, a third region, and a second region separating the first region and the third region, with the second region including a spring-like (e.g., meandering-shaped) structure as described above.

The circuit carrier, according to embodiments of the present invention, may be a cell supervision circuit (CSC) carrier. The cell supervision circuit carrier may include a circuit carrier board as described above and may have a first lateral edge and a second lateral edge that is opposite to the first lateral edge. For example, the circuit carrier board may have an essentially rectangular shape, which is adapted to the dimensions of an essentially rectangular battery module to which the circuit carrier board is or is to be mounted. Further, the cell supervision circuit carrier may further include busbar elements for electrically interconnecting the battery cells of the battery module to each other in series and/or in parallel and at least one shunt resistor connected to the busbar. The shunt resistor of the cell supervision circuit carrier may be configured to electrically interconnect battery cells of the battery module. Additionally or alternatively, the battery modules may include busbars that provide a power connection between different battery cells or different battery modules.

According to another embodiment, the circuit carrier may be a battery management system (BMS) circuit carrier. If the battery system does not include multiple battery modules, the battery management system circuit carrier may be similar to the cell supervision circuit carrier above except that further functions, such as communication with an electric vehicle, are provided by the electronics that are or are to be mounted to the battery management system circuit carrier. However, if the battery system includes a plurality of battery modules, each with a CSC as described above, the BMS circuit carrier may not be directly connected to a battery module. In this case, only the shunt resistor may be connected to a battery cell of the battery system. Further, the circuit carrier may host both a CSC and a BMS.

Further, the battery system may include a plurality of busbars for electrically interconnecting battery modules and/or a plurality of busbar elements for electrically interconnecting battery cells of the battery system or battery modules. The busbars may be made of (or may include) an electrically conductive material, such as aluminum, and may have a strip-like shape with a uniform busbar width and a uniform busbar height. However, the shape of the busbars may be suitably adapted to meet individual desires of a specific battery design, for example, in view of limited installation space. The busbar may have a straight or bent shape, or may have arbitrary curved belts, bands, ribbons, ribs, or rails. Further, the busbar elements may be configured similarly to the busbars. According to this embodiment, the shunt resistor may be configured to be connected to a busbar or a busbar element.

According to another embodiment, the further electronic components that are or are to be mounted to and/or formed in the third region include a voltage measurement circuit that is configured to be connected to the shunt resistor. As is commonly known, a shunt is used to measure a current between two nodes by drawing a current between these nodes across the shunt and by measuring a voltage drop over the shunt. The current may be derived from the measured voltage because the ohmic resistance of the shunt is known. The voltage measurement circuit that is or is to be disposed in the third region is configured to allow for such current measurement via a shunt by providing the voltage measurement and by determining the shunt current. The further electronics that are or are to be mounted to and/or formed in the third region are configured to provide further functions of a CSC or a BMS as described above.

In another embodiment, at least one voltage path is provided between the first region and the third region. Further, the at least one voltage path is formed in the second region, such as on or in the spring-like structure and/or in or on at least one of the at least one meandering-shaped structure. For example, one meandering-shaped structure between the first and third region carries (e.g., supports) the voltage path, and other meandering-shaped structures are provided for (e.g., are provided solely for) mechanically strengthening the connection between the first and third regions. The at least one voltage path according to this embodiment is configured to electrically connect the shunt resistor and the voltage measurement circuit to each other to provide the voltage drop over the shunt to the voltage measurement circuit. To provide the voltage drop to the voltage measurement circuit, the voltage path may provide at least a first and a second conductive path connecting the shunt resistance and the voltage measurement circuit. However, additional voltage paths are required to provide redundant signals to the voltage measurement circuit.

According to one embodiment, the at least one voltage path is enclosed by electrical shielding. The electrical shielding may enclose the at least one voltage path in a lateral direction and in a thickness direction of the plate-shaped circuit board. The electrical shielding may include conductive and/or magnetic materials such that a field (e.g., a magnetic field) opposite to external fields is formed that stops or reduces external fields from penetrating therethrough. The electrical shielding is electrically isolated from the at least one voltage path. Electrical shielding improves the shunt current measurement, as the voltage levels measured across the shunt may be as low as a about few microvolts and electromagnetic interference levels present in the automotive environment may, thus, greatly decrease the measurement accuracy. Hence, by using electric shielding, accurate voltage measurement may be ensured.

In one embodiment, the circuit carrier board is a multi-layer circuit carrier including at least three electrically isolated carrier layers. Multi-layer circuit carriers, such as, for example, multi-layer PCBs, are known to the skilled person. The circuit carrier board, according this embodiment, includes at least three layers to provide at least one central voltage path layer that is enclosed via at least two outer layers, which may be utilized for shielding (e.g., electrically shielding) the voltage path. However, when a redundant voltage path is included between the shunt and the voltage measurement circuit, the circuit carrier may include at least four electrically isolated layers.

Further, at least a first shunt contact pad and a second shunt contact pad that is separate from the first shunt contact pad may be disposed in or on the first region. Further, these shunt contact pads are configured to be electrically connected to the shunt resistor. The first shunt contact pad is connected to a first conductive path disposed in (or on) an inner carrier layer of the multi carrier layer circuit carrier board, and the second shunt contact pad is connected to a second conductive path disposed in (or on) the same or another inner carrier layer of the multi-layer circuit carrier board. In other words, at least one inner carrier layer includes a first conductive path configured to be connected to the first shunt contact pad and a second conductive path configured to be connected to the second shunt contact pad. The first conductive path and second conductive path may be configured to be connected to the voltage measurement circuit. To provide a redundant voltage measurement signal, third and fourth conductive paths may be included. The third and fourth conductive paths may be disposed on the same or on another inner carrier layer of the multi-layer circuit carrier board as the first and second conductive paths.

Further, at least two outer carrier layers (e.g., carrier layers enclosing the at least one inner carrier layer in a thickness direction of the circuit carrier board) include at least one metallization (or metallization layer) within the second region. The metallization may be disposed above and below the conductive paths of the inner carrier layer(s) (e.g., in the thickness direction of the circuit carrier board). Further, the metallization (e.g., the metallization layers disposed on the at least two outer carrier layers, respectively) further extends laterally in a direction opposite to a thickness or normal direction of the circuit carrier board and perpendicular to an extension direction of the conductive paths and over the conductive paths on the at least one inner carrier layer. The metallization layers disposed on the at least two outer carrier layers, respectively, are electrically connected via a plurality of vias (e.g., through-hole vias), which may be vias filled with an electrically conductive material. The vias connect parts of the metallization layers that extend laterally over the conductive paths on the inner layer(s). The vias provide lateral electric shielding to the conductive paths on the inner layer, and the metallizations provide electric shielding in the thickness direction.

Another aspect of the present invention relates to a battery system including a circuit carrier according to embodiments of the present invention as described above and a shunt resistor disposed in the first region. The shunt resistor is electrically connected to at least one current path of the battery system. The battery system further includes a first system terminal and a second system terminal and a plurality of battery cells connected to each other in series between the first system terminal and the second system terminal. The battery system may also include a plurality of battery modules connected to each other in series between the first system terminal and the second system terminal. Each battery module may include a plurality of battery cells that are electrically interconnected in series and/or in parallel between a negative module terminal and a positive module terminal. In some embodiments, each of the plurality of battery modules includes a cell supervision circuit carrier as described above as well as a cell supervision circuit (CSC) mounted to or formed in or on the respective cell supervision circuit carriers. The battery system may also include a battery management system (BMS) with a battery management system circuit carrier as described above.

The battery system may further include a plurality of busbars, and each busbar interconnects a positive module terminal of a first battery or battery module and a negative module terminal of a second battery or battery module. However, the busbars may also connect a first terminal of a first battery cell and a second terminal of a second battery cell. If the battery system includes battery modules connected to each other via busbars, the battery cells of the modules may be electrically interconnected in series and/or in parallel between the module terminals of the respective battery module via busbar elements. The busbar elements may be a part of the cell supervision circuit carrier or may be configured similarly to the busbars. The shunt resistor disposed in the first region of the circuit carrier board may be at least part of a busbar or a busbar element. For example, the shunt resistor may form part of a current path of the battery system. The busbars may be made of (or may include) an electrically conductive material, such as aluminum, and may have a strip-like shape with a uniform busbar width and a uniform busbar height. However, the shape of the busbars may be suitably varied according to individual requirements of a specific battery design, for example, in view of limited installation space. For example, the busbar may have a straight or ben shape or may be formed of arbitrary curved belts, bands, ribbons, ribs, or rails. The busbar elements may be configured as metallizations that are disposed on the circuit carrier board of the cell supervision circuit carrier or may include any type of wire, cable, metallization, or an electrically conducting polymer. In other embodiments, the busbar elements may be configured similarly to the busbars.

Further aspects and features of the present invention are disclosed in the following description.

BRIEF DESCRIPTION OF THE DRAWINGS

Aspects and features of the present invention will become apparent to those of ordinary skill in the art by describing, in detail, exemplary embodiments thereof with reference to the attached drawings, in which.

DETAILED DESCRIPTION

Figure 1:
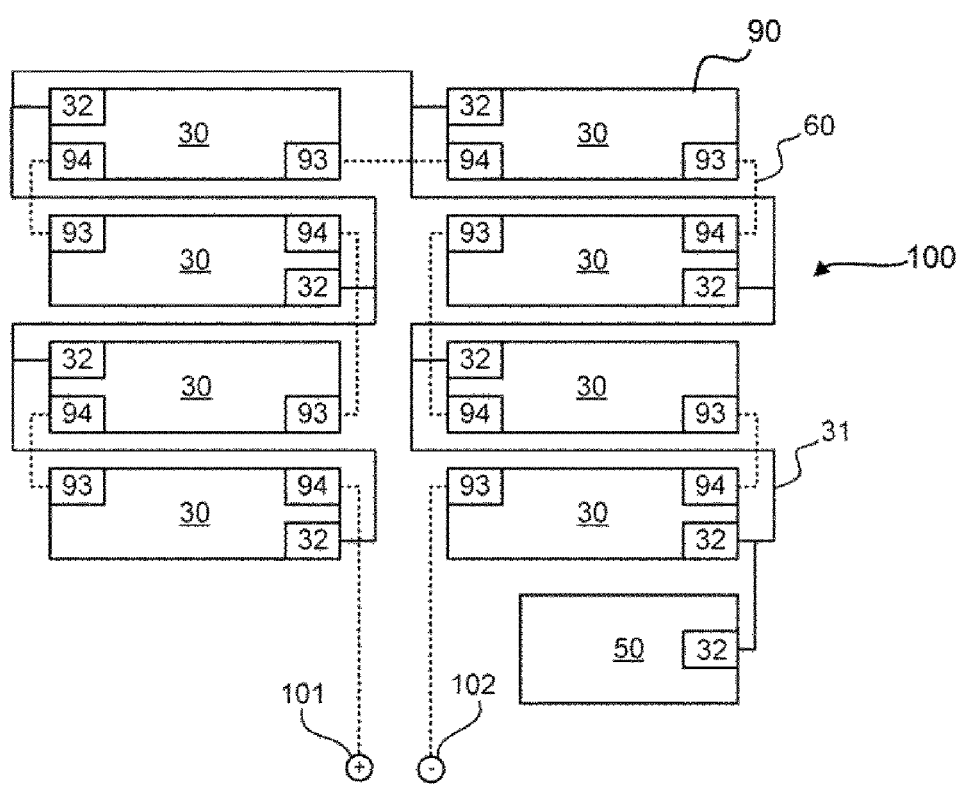
FIG. 1 is a schematic top view of a battery system according to the related art.

Reference will now be made in detail to embodiments, examples of which are illustrated in the accompanying drawings. Aspects and features of the present invention, and implementation methods thereof, will be described with reference to the accompanying drawings. In the drawings, like reference numerals denote like elements, and redundant descriptions thereof may be omitted. The present invention, however, may be embodied in various different forms and should not be construed as being limited to the embodiments illustrated herein. Rather, these embodiments are provided as examples so that this disclosure will be thorough and complete and will fully convey the aspects and features of the present invention to those skilled in the art. Accordingly, processes and elements considered not necessary for those having ordinary skill in the art to have a complete understanding of the aspects and features of the present invention may not be described in detail. In the drawings, the relative sizes of elements, layers, and regions may be exaggerated for clarity.

As used herein, the term "and/or" includes any and all combinations of one or more of the associated listed items. Further, the use of "may" when describing embodiments of the present invention refers to "one or more embodiments of the present invention." In the following description of embodiments of the present invention, the terms of a singular form may include plural forms unless the context clearly indicates otherwise. It is understood that although the terms "first," "second," etc. are used to describe various elements, these elements should not be limited by these terms. These terms are only used to distinguish one element from another element. For example, a first element may be named a second element and, similarly, a second element may be named a first element, without departing from the scope of the present invention. Expressions, such as "at least one of," when preceding a list of elements, modify the entire list of elements and do not modify the individual elements thereof.

As used herein, the terms "substantially," "about," and similar terms are used as terms of approximation and not as terms of degree and are intended to account for the inherent deviations in measured or calculated values that would be recognized by those of ordinary skill in the art. Further, if the term "substantially" is used in combination with a feature that could be expressed numerically it denotes a range of +/−5% of the value centered thereon.

It will be understood that when an element or layer is referred to as being "on," "connected to," or "coupled to" another element or layer, it may be directly on, connected, or coupled to the other element or layer or one or more intervening elements or layers may also be present. When an element or layer is referred to as being "directly on," "directly connected to," or "directly coupled to" another element or layer, there are no intervening elements or layers present. For example, when a first element is described as being "coupled" or "connected" to a second element, the first element may be directly coupled or connected to the second element or the first element may be indirectly coupled or connected to the second element via one or more intervening elements.

Spatially relative terms, such as "beneath," "below," "lower," "above," "upper," and the like, may be used herein for ease of description to describe one element or feature's relationship to another element(s) or feature(s) as illustrated in the figures. It will be understood that the spatially relative terms are intended to encompass different orientations of the device in use or operation in addition to the orientation depicted in the figures. For example, if the device in the figures is turned over, elements described as "below" or "beneath" other elements or features would then be oriented "above" or "over" the other elements or features. Thus, the term "below" may encompass both an orientation of above and below. The device may be otherwise oriented (rotated 90 degrees or at other orientations), and the spatially relative descriptors used herein should be interpreted accordingly.

The battery system 100 according to the related art as shown in FIG. 1 has been described in the introductory part of the present application. As already mentioned there, the battery system includes a plurality of battery modules 90. Each battery module 90 includes a cell supervision circuit (CSC) 30, and each of the CSCs 30 is connected to a single BMS 50. The circuit carrier as described below may be used for the CSC 30 and/or the BMS 50.

Figure 2:
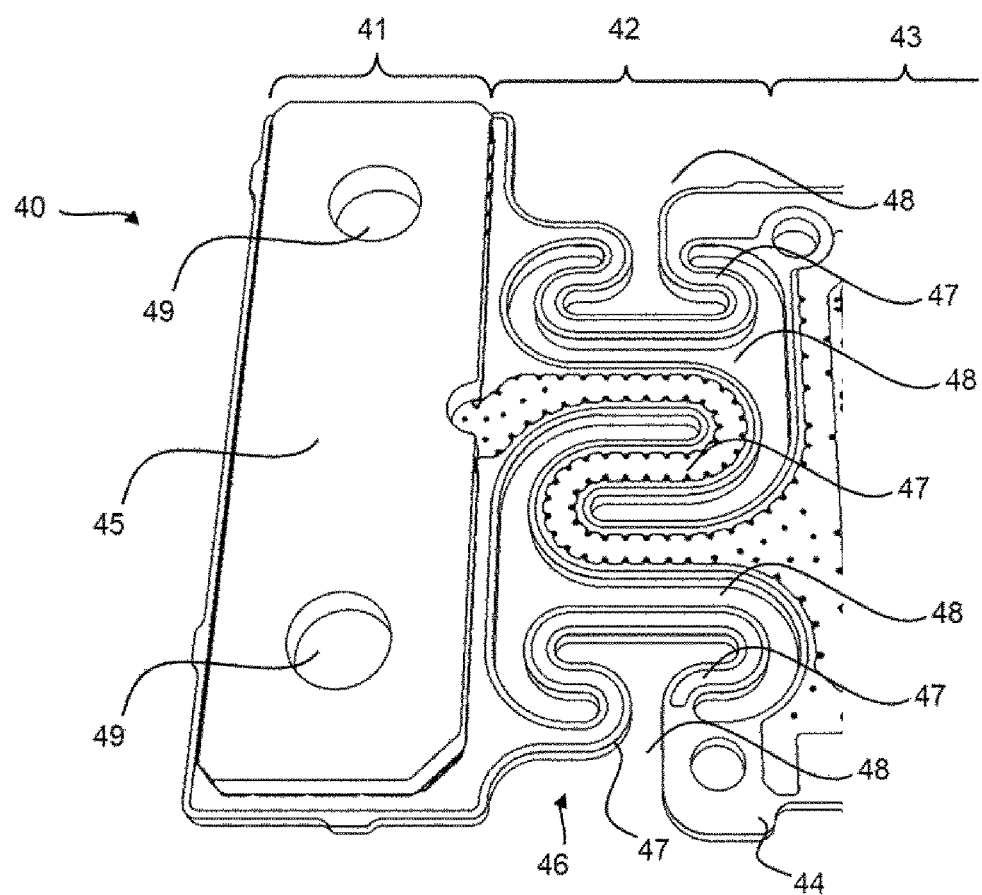
FIG. 2 is a schematic perspective view of a circuit carrier according to an embodiment of the present invention.

FIG. 2 illustrates a circuit carrier 40 according to an embodiment of the present invention. The circuit carrier 40 includes a circuit carrier board 44 and may further include other components, such as a wire-frame, packaging materials, and the like. The circuit carrier board 44 is a multi-layer printed circuit board (PCB), to be described in more detail below. The circuit carrier 40 (e.g. the circuit carrier board 44) has a first region 41, a second region 42, and a third region 43. Only a portion of the third region 43 is shown in FIG. 2.

The first region 41 of the circuit carrier 40 is configured to receive a shunt resistor 45, and the shunt resistor 45 is mounted to a surface of circuit carrier board 44 at the first region 41. The shunt resistor 45 is configured to be connected to (e.g., connected along) a current path of a battery system 100 as shown, for example, in FIG. 1. The shunt resistor 45 as shown in FIG. 2 is configured to be used as a busbar 60 or as a busbar element as described above. The first region 41 of the circuit carrier 40 and the shunt resistor 45 each have two aligned terminal openings 49 that are configured to receive cell terminals of battery cells connected via the shunt resistor 45 (or busbar element 60) or to receive module terminals connected via the shunt resistor 45 (or busbar 60).

The third region 43 of the circuit carrier 40 is configured to receive further electronic components, and the type, number, and connections of these further electronics depend, at least partially, on the intended purpose of the circuit carrier 40, such as a cell supervising circuit (CSC) carrier and/or battery management system (BMS) circuit carrier. The further electronic components may include one or more circuits, such as a voltage measurement circuit, and/or one or more circuit components configured to be connected to the shunt resistor 45 as described in more detail below.

The second region 42 of the circuit carrier 40 is configured as a spring-like structure 46 and, in the illustrated embodiment, includes three meandering-shaped structures 47 that are separated from each other by through-openings 48. Further through-openings 48 are disposed between the outermost meandering-shaped structures 47 and form part of an edge-region of the circuit carrier 40. The meandering-shaped structures 47 are formed by milling the through-openings 48 into the third region 43 to remove material from the circuit carrier board 44 in the second region 42. Each of the meandering-shaped structures 47 is formed by an elongated portion of circuit carrier board 44 material that has multiple changes of direction. Further, the meandering-shaped structures 47 are such that each of these sections provides sufficient elasticity for mechanically decoupling the first region 41 and the third region 43 of the circuit carrier board 44. These dimensions depend on the material and the thickness of the circuit carrier board 44 and eventual (or anticipated) packaging materials connected thereto and can be determined by the skilled person without undue experimentation.

Figure 3:
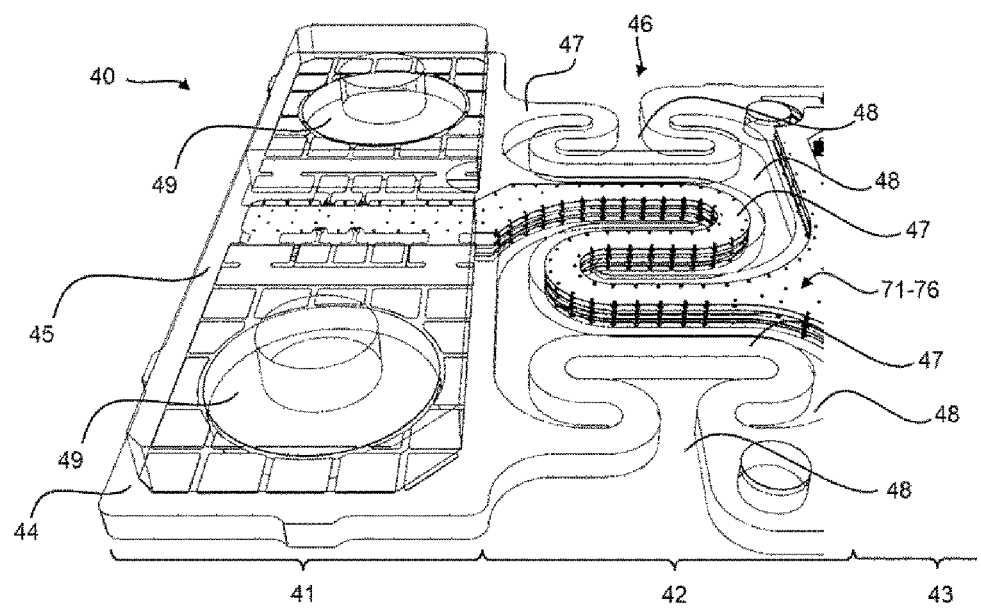
FIG. 3 is a schematic perspective, transparent view of the circuit carrier shown in FIG. 2.

As shown in more detail in FIG. 3, the first region 41 and the third region 43 include an electric structure. The first region 41 includes multiple surface metallizations that are electrically isolated from each other. Some of (or part of) these surface metallizations form contact pads as described in more detail below for, as an example, solder pads for good mechanical attachment of the shunt resistor 45 to the circuit carrier board 44 by soldering or the like. In the second region 42, the multi-layer structure of the circuit carrier board 44 is shown including six carrier layers 71-76 laminated together (e.g., laminated on each other) and electrically isolated from each other. The electric isolation may be provided by additional insulation layers between ones of the carrier layers 71-76. As shown in FIG. 3, a central meandering-shaped structure 47 provides the electric structure of the second region 42 with voltage paths and electric shielding as described in more detail below, and the two outer meandering-shaped structures 47 perform mechanical functions. However, each of the three meandering-shaped structures 47 contributes to the spring-like structure 46 between the first region 41 and the third region 43.

Figure 4:
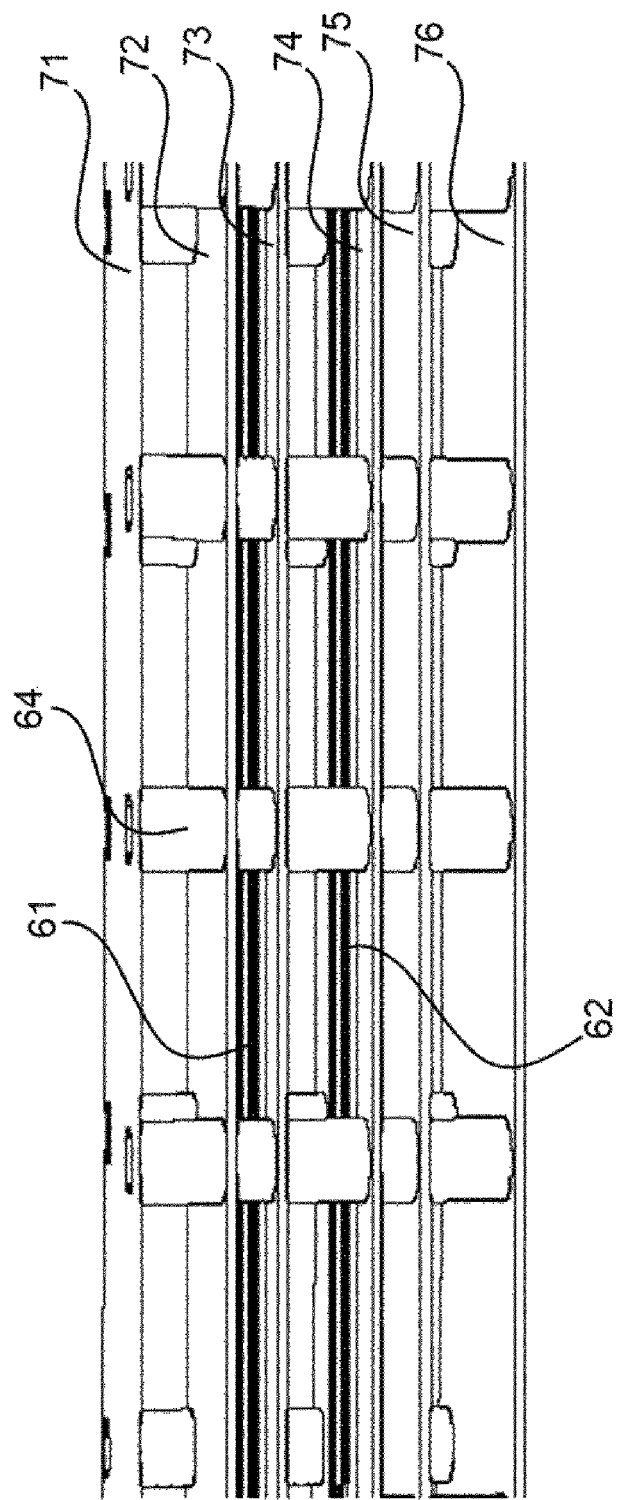
FIG. 4 is a schematic illustration of a layer structure of a circuit carrier according to an embodiment of the present invention.
Figure 5:
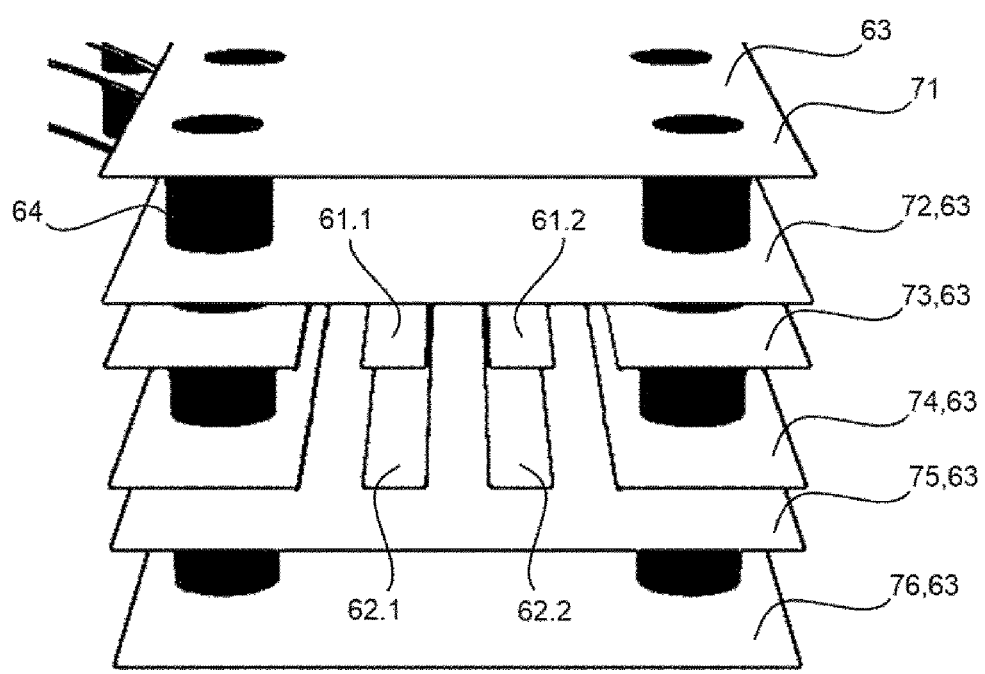
FIG. 5 is a schematic illustration of metallization layers of a circuit carrier according to an embodiment of the present invention.

FIGS. 4 and 5 show detailed views of the multi-layer structure of the circuit carrier 40, particularly of the central meandering-shaped structure 47 of the circuit carrier board 44, illustrated in FIGS. 2 and 3. FIG. 4 shows the carrier layers 71-76, and FIG. 5 illustrates the metallization on the carrier layers 71-76. As illustrated in FIG. 4, at least in the central meandering-shaped structure 47 of the second region 42, the circuit carrier board 44 includes six carrier layers, including four outer carrier layers 71, 72, 75, 76 and two inner carrier layers 73, 74. The carrier layers 71-76 are connected to each other via metal-filled vias (e.g., via openings or via holes) 64 that connect the carrier layers 71-76 to each other at lateral regions thereof. The inner carrier layers 73, 74 include a voltage path 61 and a redundant voltage path 62, respectively, that are configured to conduct an electric current between the first region 41 and the third region 43.

As shown in more detail in FIG. 5, each of the outer carrier layers 71, 72, 75, 76 includes a full surface metallization 63. The surface metallizations 63 provide electromagnetic shielding due to their polarizability. Further, the surface metallizations 63 of the third carrier layer 73 and the fourth carrier layer 74 are partially removed to create a first voltage path 61.1 and a second voltage path 61.2 to form the voltage path 61 on the third carrier layer 73 and to create a third voltage path 62.1 and a fourth voltage path 62.2 on the fourth carrier layer 74. Further, the lateral remainders of the surface metallization 63 of the third and fourth carrier layer 73, 74 are electrically connected to the metallizations 63 of the outer carrier layers 71, 72, 75, 76 via the vias 64, respectively, in order to contribute to the electromagnetic shielding.

Figure 6:
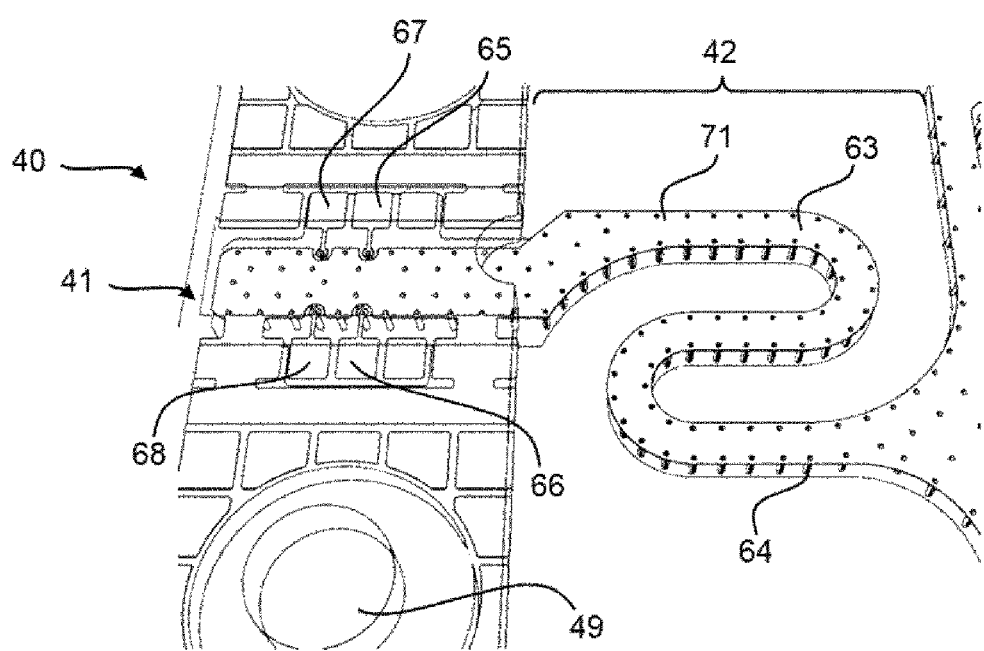
FIG. 6 is a schematic perspective view of a circuit carrier with an exposed first carrier layer according to an embodiment of the present invention.

FIGS. 6-9 illustrate further schematic perspective views of a circuit carrier 40 according to an embodiment of the present invention. In each of FIGS. 6-9, one of the carrier layers 71, 73, 74, and 76 is exposed. In FIG. 6, the second region 42 of the circuit carrier 40 is shown with an exposed first carrier layer 71, and the exposed first carrier layer 71 includes a full metallization 63 as described above with respect to FIG. 5. Further, upper ends of the plurality of vias 64 terminate at lateral regions of the first carrier layer 71. As further shown in FIG. 6, in the first region 41 of the circuit carrier 40, a first shunt contact pad 65, a second shunt contact pad 66, a third shunt contact pad 67, and a fourth shunt contact pad 68 are formed. Each of these shunt contact pads 65, 66, 67, 68 is electrically connected to one of the vias 64, respectively, and these vias 64 are separated and isolated from the metallization 63 of the first carrier layer 71. Other parts of the metallization within the first region 41 of the circuit carrier 40 that surround (e.g., extend around a periphery of) these shunt contact pads 65, 66, 67, 68 are electrically connected to the metallization 63 of the first carrier layer 71 to contribute to the electrical shielding properties of the metallization 63 on the first carrier layer 71.

Figure 7:
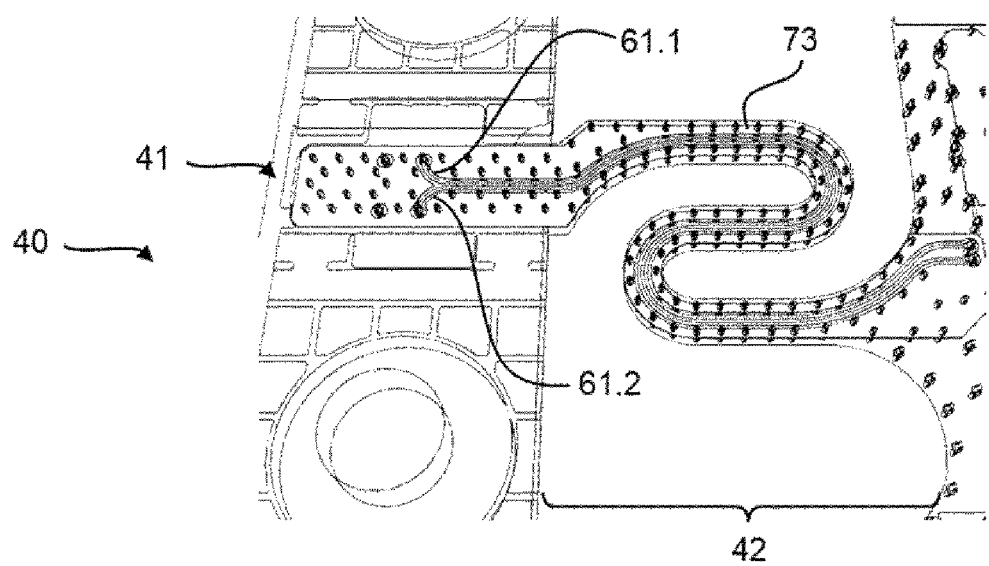
FIG. 7 is a schematic perspective view of a circuit carrier with an exposed third carrier layer according to an embodiment of the present invention.

In FIG. 7, the second region 42 of the circuit carrier 40 is shown with the exposed third carrier layer 73 including the first voltage path 61.1 and the second voltage path 61.2 as described above with respect to FIG. 5. The first voltage path 61.1 terminates in the first region 41 in the via that is connected to the first shunt contact pad 65 as shown in FIG. 6, and the second voltage path 61.2 terminates in the first region 41 in the via that is connected to the second shunt contact pad 66 as shown in FIG. 6. Hence, the voltage paths 61.1, 61.2 provide an electric connection between the shunt contact pads 65, 66 and an electronic circuit disposed in the third region 43 of the circuit carrier 40, respectively. In some embodiments, this circuit is a voltage measurement circuit, and the voltage paths 61.1, 61.2 transport the voltage potential of the first and second shunt contact pads 65, 66 to the voltage measurement circuit, respectively. Thus, a voltage drop between the first and second shunt contact pads 65, 66 may be determined (or measured). Based on this voltage drop and the known resistance of the shunt resistor 45, the electric current flowing through shunt resistor 45 may be determined (or measured). Hence, the current between the terminals that are disposed in the terminal openings 49, for example, between cell terminals or module terminals of the battery system, may be determined (or measured).

Figure 8:
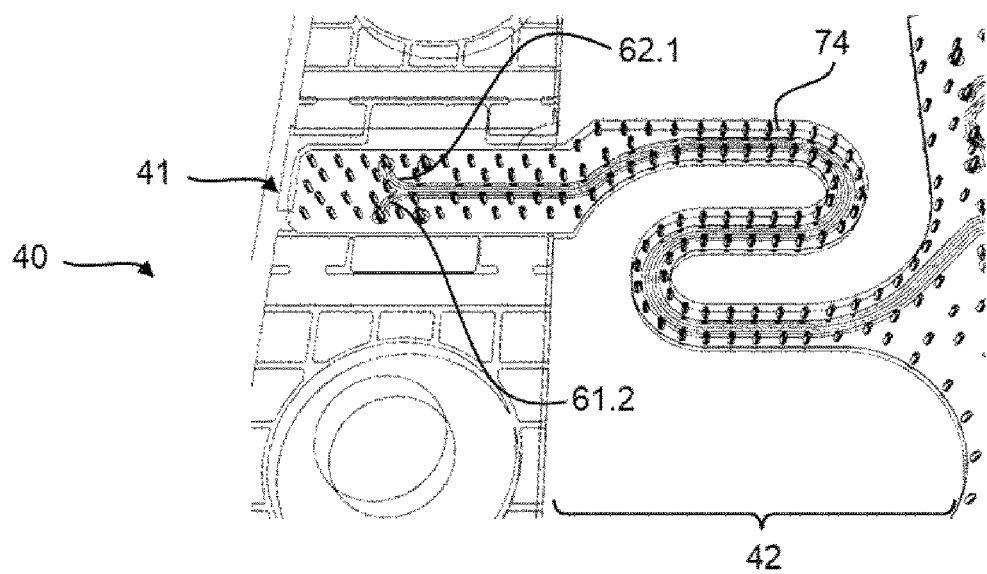
FIG. 8 is a schematic perspective view of a circuit carrier with an exposed fourth carrier layer according to an embodiment of the present invention.

In FIG. 8, the second region 42 of the circuit carrier 40 is shown with the exposed fourth carrier layer 74 including the third voltage path 62.1 and the fourth voltage path 62.2 as described above with respect to FIG. 5. The third voltage path 62.1 terminates in the first region 41 in the via that is connected to the third shunt contact pad 67 as shown in FIG. 6, and the fourth voltage path 62.2 terminates in the first region 41 in the via that is connected to the fourth shunt contact pad 68 as shown in FIG. 6. Hence, the voltage paths 62.1, 62.2 provide an electric connection between the shunt contact pads 67, 68 and an electronic circuit disposed in the third region 43 of the circuit carrier 40, respectively. This circuit may be the voltage measurement circuit described above, and the voltage paths 62.1, 62.2 provide a further voltage signal to this circuit in a redundant manner. Hence, measurement reliability and accuracy of the voltage measurement circuit, as well as the determination of the current across the shunt resistor 45, as described above are improved.

The voltage paths 62.1, 62.2 transport the voltage potential of the third and fourth shunt contact pads 67, 68 to the voltage measurement circuit, respectively. Thus, the voltage drop between the third and fourth shunt contact pads 67, 68 can be determined (or measured). Based on this voltage drop and based on the known resistance of the shunt resistor 45, the electric current flowing through shunt resistor 45 may be determined (or measured). Hence, the current between the terminals disposed in the terminal openings 49 may be determined (or measured) redundantly.

Figure 9:
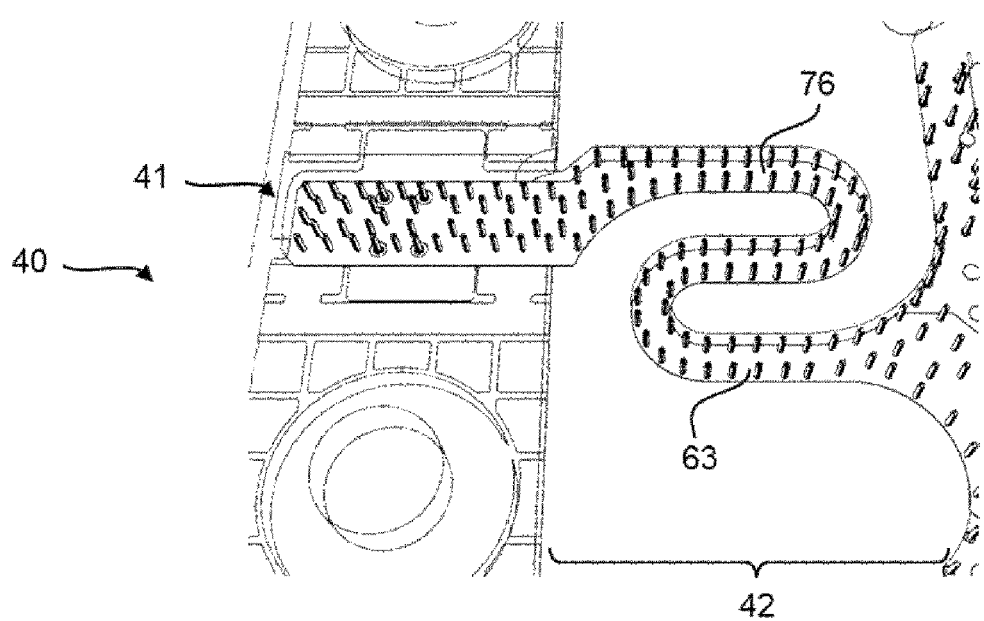
FIG. 9 is a schematic perspective view of a circuit carrier with an exposed sixth carrier layer according to an embodiment of the present invention.

In FIG. 9, the third region 43 of the circuit carrier 40 is shown with the exposed sixth carrier layer 76. The exposed sixth carrier layer 76 also includes a full metallization 63 as described above with respect to FIGS. 5 and 6. Lower ends of the plurality of vias 64 terminate in lateral regions of the sixth carrier layer 76. As further shown in FIG. 9, the metallization 63 of the sixth layer 76 is separated and, thus, electrically isolated from the via that is connected to the first shunt contact pad 65 and from the via that is connected to the second shunt contact pad 66 as shown in FIG. 6. The same holds true for the metallization 63 of the first carrier layer 71, as recognizable from FIG. 6, as well as for the metallization 63 of the second and fifth carrier layer 72, 75 that are shown in FIG. 5.

SOME REFERENCE NUMERALS 30 cell supervision circuit carrier (related art)
31 wiring harness (related art)
32 connector (related art)
40 circuit carrier
41 first region
42 second region
43 third region
44 circuit carrier board
45 shunt resistor
46 spring-like structure
47 meandering-shaped structure
48 through opening
49 terminal opening
50 battery management system (BMS)
60 busbar
61 voltage path
61.1 first voltage path
61.2. second voltage path
62 redundant voltage path
62.1 third voltage path
62.2 fourth voltage path
63 metallization
64 vias
65 first shunt contact pad
66 second shunt contact pad
67 third shunt contact pad
68 fourth shunt contact pad
71 first outer carrier layer
72 second outer carrier layer
73 third inner carrier layer
74 fourth inner carrier layer
75 fifth outer carrier layer
76 sixth outer carrier layer
90 battery module
100 battery system
101 positive system terminal
102 negative system terminal

What is claimed is:

1. A circuit carrier configured to be mounted to a battery system, the circuit carrier comprising:
    a circuit carrier board having a first region, a second region, and a third region, the first region being configured to receive a shunt resistor, the third region being configured to receive further electronic components, the first region being integral with the second region,
    wherein the first region and the third region are separated from each other by the second region, the second region being a flexible connection between the first region and the third region, the second region having a through-opening in the circuit carrier board forming a meandering-shaped, spring-like structure from the remaining portion of the circuit carrier board.

2. The circuit carrier according to claim 1, wherein the meandering-shaped, spring-like structure has portions extending in different directions with respect to each other in a plan view.

3. The circuit carrier according to claim 2, wherein the through-opening in the second region is removed by milling the circuit carrier board.

4. The circuit carrier according to claim 1, wherein the meandering-shaped, spring-like structure comprises a plurality of meandering-shaped structures separated from each other by the through-opening, and wherein the second region consists of the meandering-shaped structures and the through-opening.

5. The circuit carrier according to claim 1 being one of a cell supervision circuit carrier and/or a battery management system circuit carrier.

6. The circuit carrier according to claim 1, wherein a voltage path is provided between the first region and the third region.

7. The circuit carrier according to claim 6, wherein the voltage path is configured to electrically connect the shunt resistor and at least one of the further electronic components.

8. The circuit carrier of claim 6, wherein the voltage path is formed in the meandering-shaped, spring-like structure.

9. The circuit carrier according to claim 6, wherein the voltage path is enclosed by an electrical shield.

10. A battery system comprising the circuit carrier according to claim 1, the circuit carrier comprising a shunt resistor disposed in the first region and being electrically connected to a current path of the battery system.

11. A circuit carrier configured to be mounted to a battery system, the circuit carrier comprising:

a circuit carrier board having a first region, a second region, and a third region, the first region being configured to receive a shunt resistor, the third region being configured to receive further electronic components, wherein the first region and the third region are separated from each other by the second region, the second region being a flexible connection between the first region and the third region and comprising a spring-like structure formed from the circuit carrier board, wherein the circuit carrier board is a multi-layer circuit carrier board comprising at least three electrically isolated carrier layers, wherein a first shunt contact pad and a second shunt contact pad are in the first region, wherein a plurality of outer carrier layers from among the electrically isolated carrier layers comprise a metallization within the second region, and wherein an inner carrier layer from among the electrically isolated carrier layers comprises a first conductive path connected to the first shunt contact pad and a second conductive path connected to the second shunt contact pad.

12. The circuit carrier according to claim 11, wherein the plurality of outer carrier layers from among the electrically isolated carrier layers respectively comprise a metallization within the second region, wherein the metallizations of the outer carrier layers are electrically connected via a plurality of vias.

13. The circuit carrier according to claim 12, wherein the first conductive path and the second conductive path are enclosed by the metallization of the outer carrier layers and/or the vias.

14. The circuit carrier according to claim 11, wherein at least one of the further electronic components is configured to be connected to the shunt resistor, and wherein the first conductive path and the second conductive path are configured to be connected to the at least one of the further electronic components.

* * * * *